Figure 1:
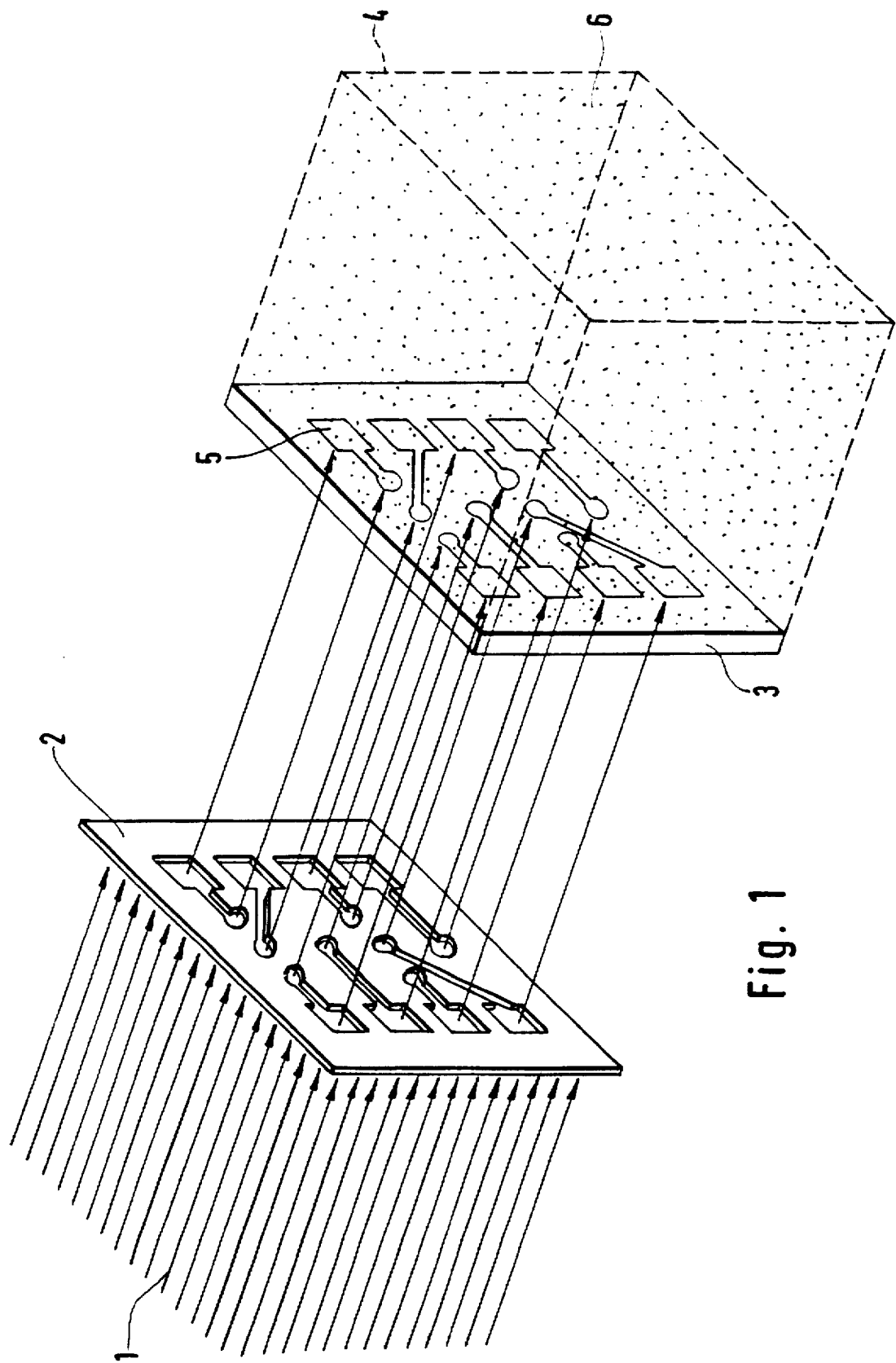

United States Patent [19]

Kickelhain

[11] Patent Number: 5,750,212
[45] Date of Patent: May 12, 1998

[54] PROCESS FOR THE DEPOSITION OF STRUCTURED METALLIC COATINGS ON GLASS SUBSTRATES

[75] Inventor: Jorg Kickelhain, Neustadt, Germany

[73] Assignee: LPKF CAD/CAM Systeme GmbH, Germany

[21] Appl. No.: 923,220

[22] Filed: Jul. 30, 1992

[30] Foreign Application Priority Data

Aug. 3, 1991 [DE] Germany ............ 41 25 863.0

[51] Int. Cl.$^6$ ............ B05D 3/06; B05D 5/12; C23C 18/14
[52] U.S. Cl. ............ 427/581; 427/597; 427/98; 427/307
[58] Field of Search ............ 427/581, 597, 427/556, 96, 97, 98, 307, 443.1

[56] References Cited

U.S. PATENT DOCUMENTS

| | | | |
|---|---|---|---|
| 2,723,919 | 11/1955 | Pohnan | 427/581 |
| 4,511,595 | 4/1985 | Inoue | 427/581 |
| 4,609,566 | 9/1986 | Hongo et al. | 427/597 |
| 4,661,679 | 4/1987 | Pardee | 427/558 |
| 4,743,463 | 5/1988 | Ronn et al. | 427/597 |
| 4,766,009 | 8/1988 | Imura et al. | 427/581 |
| 5,059,449 | 10/1991 | van der Patten et al. | 427/581 |
| 5,063,083 | 11/1991 | Eisch et al. | 427/581 |
| 5,100,693 | 3/1992 | Eisch et al. | 427/581 |
| 5,171,608 | 12/1992 | Green et al. | 427/581 |

FOREIGN PATENT DOCUMENTS

| | | | |
|---|---|---|---|
| 349946 | 1/1990 | European Pat. Off. | 427/597 |
| 9155922 | 9/1984 | Japan | 427/581 |
| 3105972 | 5/1988 | Japan | 427/581 |
| 819148 | 4/1981 | U.S.S.R. | 427/581 |

OTHER PUBLICATIONS

Translation of Esrom, EPO 0.349.946 Jan. 1990.
Translation of Nippon Electric, KK 59–155.922 Sep. 1984.

Primary Examiner—Marianne Padgett
Attorney, Agent, or Firm—Glen R. Grunewald

[57] ABSTRACT

This invention relates to a process for the application of conducting metallic, structured coatings on glass substrates, for example, for the manufacture of integrated circuits. The invention relies on placing a negative mask of the structure to be applied into the beam path of an excimer laser. After leaving the mask, the laser beam is directed onto a flat silica glass slice, the back side of which is in contact with a reductive copper bath. The process according to this invention requires exposure times no longer than seconds, after which the process proceeds autocatalytically. It can be stopped as soon as the desired coating thickness has been attained.

8 Claims, 2 Drawing Sheets

PROCESS FOR THE DEPOSITION OF STRUCTURED METALLIC COATINGS ON GLASS SUBSTRATES

This invention relates to a process for the deposition of conducting metallic, structured coatings on glass substrates.

The miniaturization of electronic assemblies and of the conductor structures they contain requires increasingly smaller conductor path widths and spacings. In an effort to realize the highest possible component density, the requirements for structural accuracy and quality of insulation channels and conductor paths are becoming evermore stringent.

The condition of the substrate onto which the structured layer is to be deposited also plays an important part. In the field of microelectronics, particularly in the manufacture of integrated circuits, quartz (silica) glass has assumed a dominant role as a wiring substrate. The advantages of silica glass are its good dielectric properties and also the similarity of its thermal expansion coefficient to that of copper, which is the material commonly used for structuring.

The deposition of a structured layer on the quartz glass slice poses a problem, however. One knows how to apply a copper foil onto silica glass by hot pressing, followed by structuring. This is known, for example, from photo etching technology used in the manufacture of printed circuits. Unfortunately, this technique prevents the realization of high conductor path densities due to such known problems as limited resolution power in the photo resist and masking technologies and insufficient etching of the conductor path structure. One also knows how to deposit a structured layer by vaporizing copper on silica glass with the aid of a mask. Such a chemical vapor deposition sputtering process requires expensive equipment and techniques, typically involving high-temperature operation in a clean room under vacuum.

The aim of this invention is to come up with a process of the kind described earlier that would allow, on the one hand, good resolution of structuring and, on the other, a less costly process than hot pressing or sputtering.

The problem is solved, according to this invention, by placing a mask with the negative of the structure to be applied into the beam path of an excimer laser. The laser beam leaving the mask is then directed to a flat silica glass slice, the back side of which is in contact with a reductive copper bath.

Excimer lasers are noble-gas lasers that make their emitted light available in a certain area and that are suitable for the initiation of predominantly photolytic, cold reactions. As a result, one can structure the entire glass substrate by the use of a mask in a single step and without rastering. The process permits excellent resolution in the micron range as well as the formation of a homogeneous metal structure, characterized by sharp edges and uniform thickness. What is remarkable also is that this structuring process requires very little time: exposures on the order of seconds are sufficient. The segregation process then proceeds independently (autocatalytically) until the desired thickness is obtained and when the process is stopped.

The excimer laser emits preferentially in the wavelength range from 157 to 308 nm. Silica glass is characterized by a high transmittance at these wavelengths.

The reductive copper bath is contained in a cuvette in such a way that the silica glass slice forms a side wall of the cuvette. The silica glass slice is connected with the cuvette preferably in a way that would seal it, though removably.

However, the silica glass slice may also be arranged obliquely and the reductive copper bath may wash the backside of the glass slice in a continuous flow.

In order to increase the adhesion to the glass slice, it is advantageous to subject the surface of the side to be coated to a pretreatment consisting of surface roughening or etching, for example.

The invention will become more readily understood by the embodiments exemplified in the drawings. In these drawings FIG. 1 shows the apparatus for carrying out the process according to this invention; and FIG. 2 shows an alternate apparatus.

Figure 2:
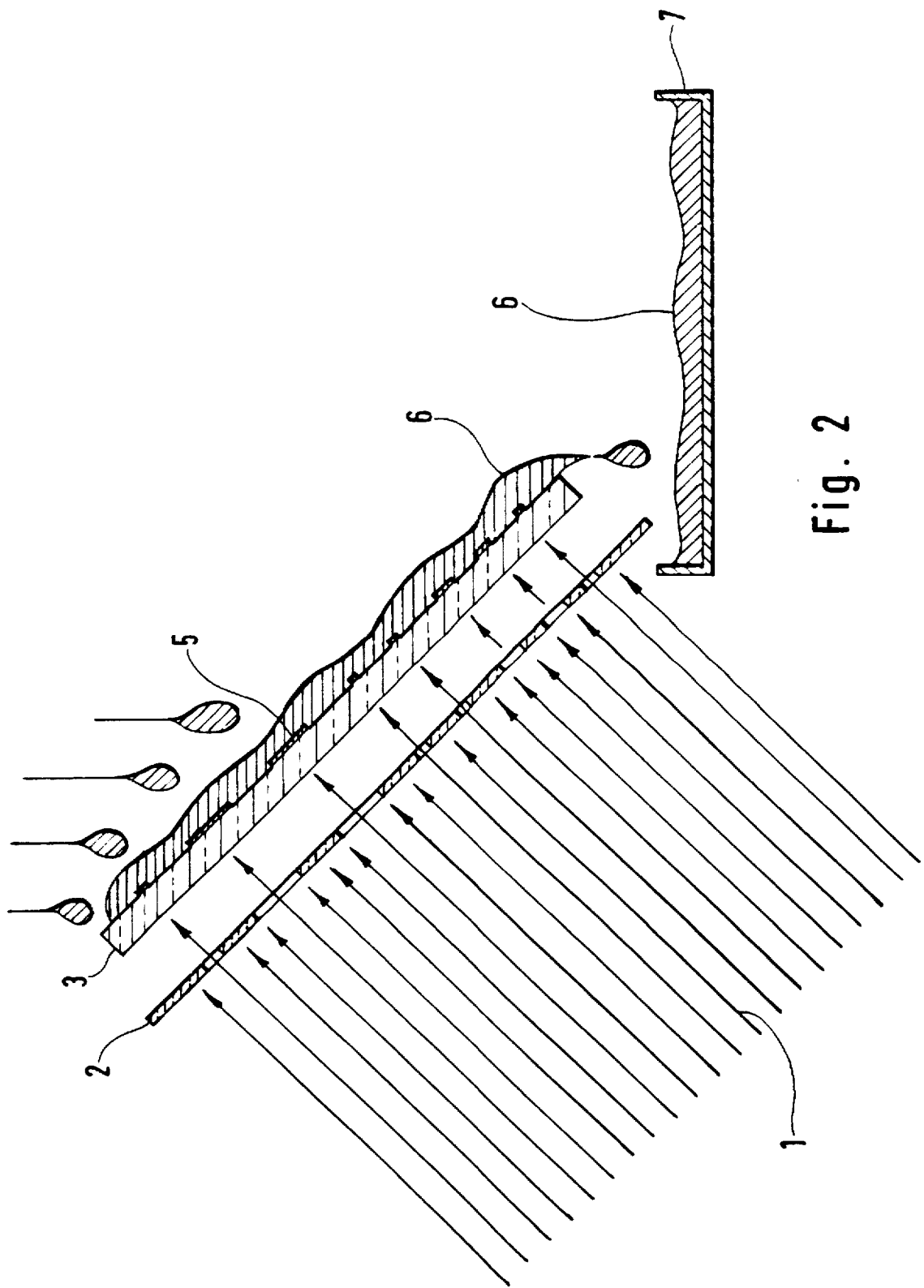

In the arrangement shown in FIG. 1, one can see a mask 2 in the path of beam 1 emitted by an excimer laser at a wavelength of 248 nm, for example. This mask is made of CrNi, brass, vapor-deposited silica glass or a similar material. It contains the desired conductor path layout to be deposited in a negative form. Mask 2 is placed on or in the vicinity of the outer side of the silica slice 3 to be coated, although in the drawing the distance between them is exaggerated. Irregularities along the edges of the mask, which could have led to a distortion of the image, were not observed, thanks to the thanks to the wavelength of the laser beam selected. The silica glass slice 3 forms one sidewall of cuvette 4 which contains a reductive copper bath (also called "chemical copper"). The silica glass slice is attached to the cuvette so that it would seal it, though not permanently.

At the sides where the laser radiation passes unhindered through the mask and thus also through the silica glass until it reaches the phase boundary layer glass/copper bath, there takes place a selective, adhering deposition of the metal on the inside of the silica glass (full additive conductor path buildup). Because of the short wavelength (ultraviolet) of the laser beam and the high photon energies connected with it, photolytic reactions are tripped at the silica glass/copper bath phase boundary. This in turn leads to the deposition of an adhering copper layer corresponding to pattern 5 of the laser beam transmitted through the mask 2.

The light emitted by the excimer laser onto a surface of 6 cm×6 cm has the required energy density of up to 600 mJ/cm$^2$ to start the deposition with the result that the entire silica glass slice can be structured in a single step.

The exposure time is only a few seconds and after that the deposition proceeds autocatalytically at a rate of about 3–15 microns/hour; the deposition process is then stopped as soon as the desired thickness has been reached.

In the embodiment according to FIG. 2, the silica glass slice 3 is arranged obliquely and the reductive copper bath 6 is recirculated across the back side of the silica glass from container 7. Still another alternative is to spray the back side of the silica glass slice with the bath.

In order to increase the adhesion of the coating to the glass, it is expedient to pretreat the back side by surface roughening or etching, for example.

I claim:

1. A process for depositing a layer of copper in a pattern on the back face of a flat silica glass piece having a back face and a front face comprising, maintaining said back face in contact with a reductive copper liquid solution, positioning a mask having an open area that is shaped in said pattern between said front face and a source of an excimer laser beam having sufficient energy to cause copper to deposit on said back face, directing said excimer laser beam through said mask and onto said front face whereby copper in said pattern deposits from said liquid onto said back face.

2. The process of claim 1 wherein said excimer laser operates in a wave length range of 157–308 nm.

3. The process of claim 1 characterized in that said mask is attached to said front face.

4. The process of claim 1 wherein said silica glass piece forms a side wall of a cuvette, said back face faces the interior of said cuvette and said cuvette is filled with said copper solution.

5. The process of claim 1 wherein said silica glass piece is maintained obliquely to horizontal and said copper solution streams in continuous flow across said back face.

6. The process of claim 1, wherein said reductive copper solution is sprayed onto said back face.

7. The process of claim 1 wherein said back face is pretreated to increase adhesion of copper.

8. The process of claim 1 wherein said pretreatment comprises roughening.

* * * * *